United States Patent
See (10) Patent No.: US 6,593,826 B2
(45) Date of Patent: Jul. 15, 2003

(54) WIRELESS PHONE SYSTEM WITH VOLTAGE CONTROLLED OSCILLATOR

(75) Inventor: Puay Hoe See, San Diego, CA (US)

(73) Assignee: Qualcomm, INC, San Diego, CA (US)

( * ) Notice: Subject to any disclaimer, the term of this patent is extended or adjusted under 35 U.S.C. 154(b) by 211 days.

(21) Appl. No.: 09/850,508

(22) Filed: May 7, 2001

(65) Prior Publication Data

US 2001/0017575 A1 Aug. 30, 2001

Related U.S. Application Data

(62) Division of application No. 09/453,647, filed on Dec. 3, 1999.
(60) Provisional application No. 60/152,259, filed on Sep. 1, 1999, and provisional application No. 60/146,945, filed on Aug. 2, 1999.

(51) Int. Cl.[7] ............... H03B 5/12; H03L 1/00; H04L 27/00
(52) U.S. Cl. .......... 331/179; 331/36 C; 331/117 R; 331/175; 331/177 V; 375/296; 375/350; 455/261
(58) Field of Search .......... 331/36 C, 117 R, 331/117 FE, 167, 175, 179, 177 V; 375/295, 296, 344, 350; 455/255, 260, 261, 262

(56) References Cited

U.S. PATENT DOCUMENTS

| 5,625,325 A | * | 4/1997 | Rotzoll et al. ............... 331/16 |
| 5,745,013 A | * | 4/1998 | Hohmann ................... 331/179 |
| 5,856,763 A | * | 1/1999 | Reeser et al. ................. 331/49 |
| 6,097,258 A | * | 8/2000 | Van Veenendaal ...... 331/117 R |

* cited by examiner

Primary Examiner—David C. Mis
(74) Attorney, Agent, or Firm—Philip Wadsworth; Charles Brown; Howard Seo (57) ABSTRACT

An RF Voltage Controlled Oscillator (VCO) design having improved power supply noise immunity. More particularly, a VCO resonant circuit that provides a high circuit Q, immunity to noise, and is tunable over multiple distinct bands. The resonant circuit is implemented in conjunction with an integrated circuit oscillator that requires a tuned circuit to determine the frequency of operation. When the integrated circuit oscillator is used as a Local Oscillator (LO) within a wireless phone it is subjected to numerous sources of power supply noise. In a Code Division Multiple Access (CDMA) wireless phone system the power supply to portions of the RF transmit path are cycled on and off depending on the transmitted data rate. The present invention provides an oscillator with increased immunity to the noise induced on the power supply due to power supply cycling.

15 Claims, 6 Drawing Sheets

WIRELESS PHONE SYSTEM WITH VOLTAGE CONTROLLED OSCILLATOR

CROSS REFERENCE TO RELATED APPLICATION

This is a divisional of application Ser. No. 09/453,647, filed Dec. 3, 1999. Which claims claims benefit of 60/146,945, filed Aug. 2, 1999 and claims benefit of 60/152,259 filed Sep. 1, 1999.

BACKGROUND OF THE INVENTION

I. Field of the Invention

The present invention relates to electronic circuits. More particularly, the present invention relates to a novel and improved band switched Voltage Controlled Oscillator (VCO) with noise immunity.

II. Description of the Related Art

Wireless communication systems rely on the predictable performance of over the air Radio Frequency (RF) links. Wireless phone systems are required to simultaneously monitor and control numerous RF links.

A mobile unit or wireless phone integrates numerous complex circuits. An RF transceiver is used to provide the wireless communication link with base stations. The RF transceiver is comprised of a receiver and a transmitter. The receiver receives the RF transmission from the base station via an antenna interfaced to the mobile unit. The receiver amplifies, filters, and downconverts the received signal to baseband signal. The baseband signal is then routed to a baseband processing circuit. The baseband processing circuit demodulates the signal and conditions it for broadcast through a speaker to the user.

User input via keypad presses or voice input to a microphone is conditioned in the baseband processing circuit. The signal is modulated and routed to the transmitter. The transmitter takes baseband signals generated at the mobile unit and upconverts, filters, and amplifies the signal. The upconverted RF signal is transmitted to the base station through the same antenna as used for the receiver.

Frequency synthesizers are used to generate the local oscillator signals required to perform the downconversion in the receiver and the upconversion in the transmitter. Frequency synthesis is used to generate the local oscillator signal because of the synthesizer's frequency stability, the spectral purity of the resultant signal, and the ability for digital control.

Frequency synthesizers are classified as direct or indirect. In Direct Digital Synthesis logic circuits generate a digital representation of the desired signal and a D/A converter is used to convert the digital representation into an analog waveform. One common way of implementing DDS is to store a table of waveform phases in memory. Then the rate at which the phases are clocked out of memory is directly proportional to the frequency of the output signal. While DDS can generate an extremely accurate representation of a sine wave, the output frequency is limited by the clocking rate.

Indirect synthesis utilizes a phase lock loop locked to the output of an oscillator. Indirect frequency synthesis is more popular for high frequency designs because the output of a high frequency oscillator can be divided down to a frequency within the operating range of the phase lock loop.

Figure 1:
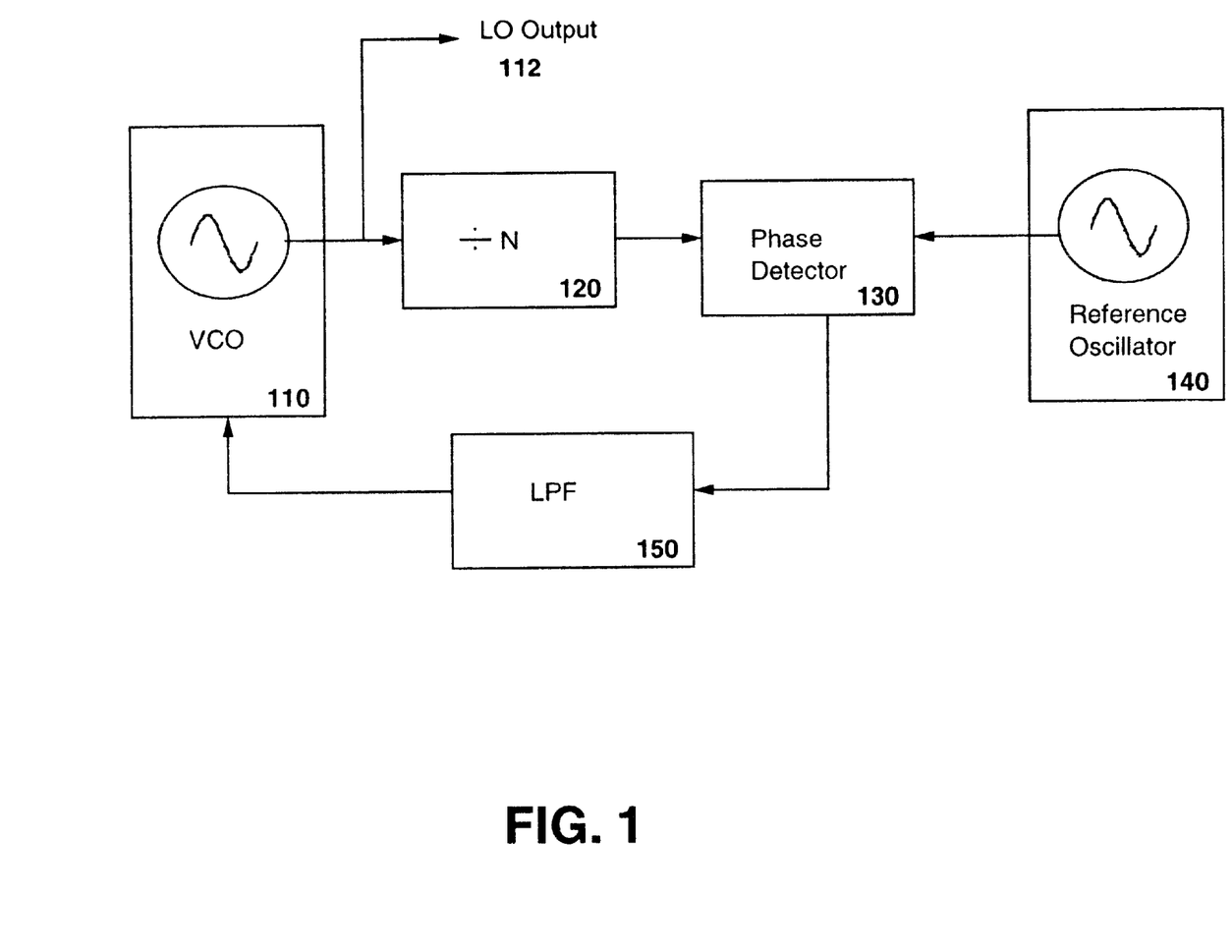
FIG. 1 is a block diagram of a synthesized local oscillator.

FIG. 1 shows a block diagram of an indirect frequency synthesizer utilizing a phase lock loop. A VCO 110 capable of tuning over the desired frequency range is used to provide the LO output 112. The output of the VCO 110 is also sent to the input of a frequency divider circuit 120, denoted ÷N where N represents the divider ratio. The divided output is provided as a first input to a phase detector 130. A second input to the phase detector 130 is the output of a reference oscillator 140. The phase lock loop operates to tune the output of the VCO 110 such that the output of the frequency divider 120 is identical to the output of the reference oscillator 140. The phase detector 130 provides an output signal corresponding to a phase error between the two input signals. The phase detector 130 output is conditioned through a Low Pass Filter (LPF) before it is provided to the frequency control input of the VCO 110. Thus, the VCO 110 is controlled to maintain phase lock with the reference oscillator 140. It can be readily deduced from the block diagram that incrementing or decrementing the value of the divider ratio N results in a frequency change in the LO output 112 equal to the reference oscillator 140 frequency. The frequency of the reference oscillator 140 determines the frequency step size of the LO.

Frequency variations in the VCO 110 output can only be corrected by the phase lock loop if the rate of the frequency variations is less than the loop bandwidth. The phase lock loop is unable to correct for VCO frequency variations that occur at a rate higher than the loop bandwidth. The settling time of the phase lock loop will depend on the initial frequency offset and the loop bandwidth. A wider loop bandwidth results in a faster settling time. A VCO with good noise immunity will reduce frequency variations thereby reducing the settling time of the phase lock loop. Therefore, it is important to design a VCO with good noise immunity while maintaining the frequency tuning characteristics.

Figure 2A:
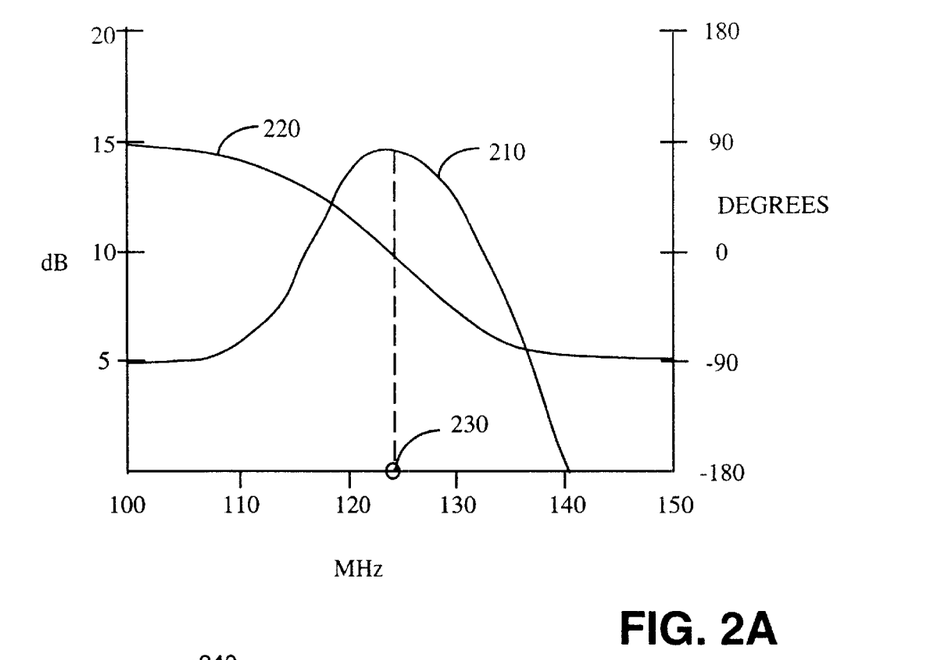
FIGS. 2A–2B are amplitude and phase plots characterizing oscillator circuits.

A VCO is merely a tunable oscillator. A typical oscillator circuit is comprised of an amplifier and a resonant circuit commonly referred as a resonant circuit. The resulting oscillator has a frequency output where the gain is greater than unity and the phase is equal to zero. The resonant circuit sets this frequency of oscillation. The relationship is most easily seen on a Bode diagram. FIG. 2A illustrates a Bode diagram for a typical oscillator. Curve 210 is representative of the gain in decibels of the oscillator as referenced to the left vertical axis and Curve 220 is representative of the phase in degrees as referenced to the right vertical axis. As indicated by Point 230, the oscillation occurs when the oscillator gain is approximately 14 dB and the phase is zero producing an oscillation at approximately 124 MHz.

To create a VCO the resonant circuit is comprised of at least one variable component wherein the reactance of the variable component is a function of a control signal, typically a voltage level, so that the frequency of zero phase, and consequently the frequency of oscillation, is also variable. When the VCO is required to tune over a large frequency range the variable component must be capable of tuning the resonant circuit over the large frequency range. Possible circuit implementations for a variable resonant circuit capable of covering a large frequency range include a resonant circuit incorporating a highly sensitive variable component or a resonant circuit requiring an extended control voltage range. The first alternative presents some problems because the VCO gain, measured in terms of MHz/Volt, becomes very high. This results in large frequency changes for relatively small control voltage changes and makes the VCO more susceptible to noise induced on the tuning line. The second alternative also has disadvantages since the required control voltage range is very large. Large control voltages can present a problem in mobile battery powered electronics having limited available supply voltage ranges.

A third alternative to designing a VCO to cover a wide tuning range can be implemented in applications where distinct frequency bands must be supported. This situation occurs commonly in the design of a dual band wireless phone. Wireless phones most commonly operate in the cellular band (Transmit band 824–849 MHz, Receive band 869–894 MHz) and the Personal Communication System (PCS) band (Transmit band 1850–1910 MHz, Receive band 1930–1990 MHz). A single phone can be designed to operate in both cellular and PCS bands. The frequency plan within the phone is typically designed to minimize the number of oscillators thereby minimizing the cost of the phone. However, even the most judicious frequency plan requires different LO frequencies when operating in one band over the other. In order to support both the cellular and PCS operating bands, components are selectively switched in the resonant circuit of the oscillator. Components are included in the resonant circuit of an oscillator and switched to the diode switches. The circuit's operating frequency limits the particular type of diode used for the switch. When the switch is in the closed position the diode must be capable of carrying varying RF currents while maintaining a minimal resistance. When the switch is in the open position the diode must be capable of isolating the RF voltages and maintaining a high resistance. A PIN diode switch is commonly used at RF frequencies for a switch although other types of diodes may be used as a switch. Additionally, the circuit is not limited to the use of a diode switch. Any switch that is capable of carrying RF currents in the closed position and is capable of RF isolation in the open position can be implemented within the circuit.

When the diode switch is forward biased the switched component becomes active within the resonant circuit. When the diode switch is not forward biased, the component does not contribute electrically to the resonant circuit. Switching a component in the resonant circuit greatly extends the tuning range of the oscillator without a corresponding increase in the VCO gain.

Figure 2B:
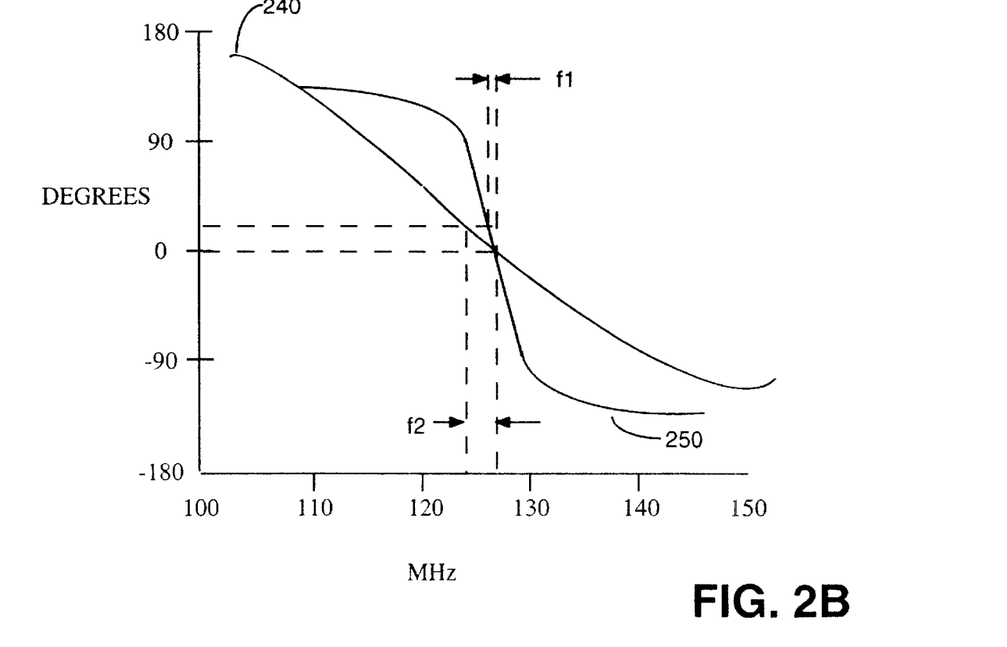

It is not sufficient that the resonant circuit tune the oscillator to the desired operating frequency. The Q of the resonant circuit is important in maintaining a specific output frequency at a given control voltage level. FIG. 2B depicts the phase response of two resonant circuits having different Q values. A lower circuit Q generates a more gentle phase response, whereas a higher circuit Q generates a sharper phase response. A higher circuit Q is desired to minimize the effects of small phase variations on output frequency. The phase response of a circuit having a relatively low circuit Q is shown in curve 240. Curve 250 illustrates a circuit having a higher circuit Q. It can be seen for a given phase variation the change in frequency is more pronounced in the circuit having the lower circuit Q. The magnitude of f2, the frequency change in a low Q circuit for a given phase variation, is greater than the magnitude of f1, the frequency change in a high Q circuit for the same phase variation.

Application specific integrated circuits are available that integrate many wireless phone functions into a single IC. Frequency synthesizer IC's are available that integrate nearly all of the required synthesizer circuits onto one chip. Typically, the user of one of these IC's only needs to provide a resonant circuit, loop filter, and reference oscillator in addition to the IC in order to produce a synthesized LO. The remaining elements of the synthesizer, the amplifier portion of the VCO, the frequency divider, and the phase detector are integrated onto one IC. The user provides the resonant circuit required generating the desired output frequency. The user also provides the low pass filter design generating the desired loop bandwidth.

Although application specific IC's simplify the implementation of the LO in a wireless phone, the wireless phone operating environment presents additional noise sources which must be considered. Cost and space limitations in a wireless phone further constrain available noise filtering solutions.

The mobile phone design differs greatly depending on the particular mobile system it is supporting. Specifications outlining mobile phone design include Telecommunications Industry Association (TIA)/Electronic Industries Association (EIA) IS-95-B MOBILE STATION-BASE STATION COMPATABILITY STANDARD FOR DUAL-MODE SPREAD SPECTRUM SYSTEMS as well as TIA/EIA IS-98-B, RECOMMENDED MINIMUM PERFORMANCE STANDARDS FOR DUAL-MODE SPREAD SPECTRUM CELLULAR MOBILE STATIONS. The specification covering the operation of a CDMA system in the Personal Communication Systems (PCS) band is the American National Standards Institute (ANSI) J-STD-008 PERSONAL STATION-BASE STATION COMPATIBILITY REQUIREMENTS FOR 1.8 TO 2.0 GHZ CODE DIVISION MULTIPLE ACCESS (CDMA) PERSONAL COMMUNICATIONS SYSTEMS. Similarly, the phone, or personal station, is specified in ANSI J-STD-018, RECOMMENDED MINIMUM PERFORMANCE REQUIREMENTS FOR 1.8 TO 2.0 GHZ CODE DIVISION MULTIPLE ACCESS (CDMA) PERSONAL STATIONS. Additionally, the mobile phone specification defines features which, when implemented in phone hardware, tend to increase sources of noise within the phone.

One beneficial feature that is utilized in CDMA phone systems such as those specified in IS-95 and J-STD-008 is multiple data rate sets. In order to take advantage of the variable nature of a wireless phone communication link, the CDMA specifications provide for data transmission at reduced rates. When a person is engaged in a telephone conversation there are numerous periods in which only one party will be speaking. During periods of reduced speech activity the telephone can reduce the data rate of the transmission resulting in a lower average transmit power level.

The communication link from the wireless phone back to the base station is termed the reverse link. On the reverse link, reduction in average transmit power is accomplished by turning off the transmitter for a fraction of the time during periods when activity is low. In a CDMA reverse link the phone always transmits at the full data rate however, when the internal structure allows operation at a reduced data rate the data is repeated a number of times. As an example, when the phone is able to operate at one-half of the full data rate the information is repeated twice to bring the transmitted data rate up to the full data rate. Similarly, one-fourth rate data is repeated four times to achieve a full data rate.

To conserve power on the reverse link, each 20 mS data frame is subdivided into sixteen 1.25 mS time groupings. When the phone is operating at a full data rate all sixteen of the groups within the frame are transmitted. However, when the phone is operating at a reduced data rate only a fraction of the sixteen groups is transmitted. The fraction of groups transmitted is equal to the reduction in the data rate. When the phone operates at one-half the full data rate one-half of the groups is transmitted. However, note that no data is lost since data is repeated in inverse proportion to the data rate reduction. One-half rate data is repeated twice but only half of the data is transmitted. The redundant portion of the data is not transmitted. Similarly, one-eighth rate data is repeated eight times but only one-eighth of the data is transmitted.

When the phone operates at a reduced data rate, power is gated to select active circuits on the transmit path. The power to the circuits is gated off when the data is not being transmitted. The power is gated back on to the circuits prior to transmitting the desired data group. Power gating serves to conserve power within the wireless phone. This results in a much desired extended battery life.

An adverse effect of power gating is the sudden load changes applied to the phone power supply. The portions of the RF transmit path that are switched on and off present the greatest loads on the power supply. Therefore, during power gating, the phone power supply is subjected to the greatest load variations that it will experience. Since no power supply is insensitive to load variations the output of the power supply will exhibit voltage ripple at the rate that power gating occurs. The actual voltage ripple on the supply voltage lines is a function of the power supply load rejection, the rate of power gating, and the change in power supply load due to power gating. The change in power supply load varies in relation to the RF communication link the phone is maintaining with the base station. The change in load current will be greater when the phone is transmitting at a higher RF power level than when the phone is transmitting at a decreased RF power level. The power gating may occur at each 1.25 mS time grouping used for each data frame on the reverse link. This results in a power supply load variation with a significant 800 Hz frequency component.

What is desired is a voltage controlled oscillator design that maintains a stable output frequency with a constant control voltage applied. The VCC must be able to be switched such that it is tunable over two distinct frequency bands. Moreover, the VCO output must be insensitive to power supply noise. Specifically, when the VCO is implemented in a CDMA phone the VCO output must be insensitive to power supply noise created by power gating the RF transmit path. Another object of the invention is the design of a high Q, low cost, low component count, component switched, noise insensitive circuit for use as a resonant circuit within a VCO.

SUMMARY OF THE INVENTION

The present invention is a novel and improved multiple band Voltage Controlled Oscillator (VCO) having increased noise immunity. Additionally, the invention may be viewed as a novel resonant circuit configuration that contains switched components, has high Q, and is insensitive to noise. The novel resonant circuit can be implemented with an amplifier or application specific integrated circuit to generate a VCO having the characteristics of multiple band coverage, noise insensitivity, and frequency stability.

In a first embodiment all of the elements of the resonant circuit are connected in a balanced configuration with the exception of the inductor. First and second coupling capacitors comprise the positive and negative balanced connections to the resonant circuit. The outputs of the first and second coupling capacitors are interconnected using an inductor in series with a switched capacitor. A first tuning capacitor connects the output of the first coupling capacitor to a first variable capacitor. A second tuning capacitor connects the output of the second coupling capacitor to a second variable capacitor. The opposite ends of the first and second variable capacitors are connected together thereby maintaining a balanced configuration with respect to the balanced connections of the resonant circuit. A diode switch is connected in parallel with the switched capacitor such that the switched capacitor is electrically connected to the resonant circuit when the diode switch is not forward biased. The switched capacitor is not electrically connected to the resonant circuit when the diode switch is forward biased.

In the first embodiment the first and second tuning capacitors are utilized as a voltage controlled variable circuit. In the first embodiment the capacitance value of the variable circuit is changed with the application of a control voltage. Any type of variable circuit whose impedance changes according to an applied voltage can be used in a resonant circuit to enable the resonant frequency to be tuned using a control voltage. The preferred embodiments described in the present invention utilize variable capacitors as the variable circuit.

Operation of the switch causes the center frequency of the VCO to shift between two values, $f_1$ and $f_2$. More particularly, actuation of the switch causes the resonant frequency of the resonant circuit to vary, thereby shifting the center frequency of the VCO between $f_1$ and $f_2$.

The first embodiment has the advantage of a maximized circuit Q. This is because only one inductor is utilized in the circuit. Inductor Q is the limitation to achieving high circuit Q. The elimination of the majority of inductors in the circuit maximizes the circuit Q. However, the circuit is not as noise insensitive as the second embodiment.

In a second embodiment all of the elements of the resonant circuit are connected in a balanced configuration. First and second coupling capacitors comprise the positive and negative balanced connections to the resonant circuit, just as in the first embodiment. The outputs of the first and second coupling capacitors are connected to first and second inductors. The first and second inductors are each connected to one of the coupling capacitors and ground. A first tuning capacitor connects the output of the first coupling capacitor to a first variable capacitor. A second tuning capacitor connects the output of the second coupling capacitor to a second variable capacitor. The opposite ends of the first and second variable capacitors are connected together thereby maintaining a balanced configuration with respect to the balanced connections of the resonant circuit. The second embodiment, as presently described, is completely balanced with respect to the input of the resonant circuit. One end of the switched capacitor is connected to the output of the second coupling capacitor. The switched capacitor is connected in series to the diode switch that is then connected to the output of the first coupling capacitor. The output of the first coupling capacitor is connected to the output of the second coupling capacitor using the switched capacitor in series with the diode switch. The resonant circuit is indifferent to whether the switched capacitor is connected to the output of the first coupling capacitor with the diode switch connected to the output of the second coupling capacitor or if the positions of the switched capacitor and diode switch are transposed.

Operating the switch causes the center frequency of the VCO to shift between two values, $f_1$ and $f_2$. More particularly, actuation of the switch causes the capacitance associated with resonant circuit to vary, thereby shifting the resonant frequency of the resonant circuit and thus changing the center frequency of the VCO from $f_1$ to $f_2$.

The second embodiment also has greater noise immunity due to an additional pole in high pass filter. When viewed from the inputs each of the balanced inputs has effectively a high pass filter configuration. This is due to the configuration of the coupling capacitors in relation to the inductors. This high pass filter effectively acts to remove the majority of noise induced onto the resonant circuit. The noise is eliminated from affecting the variable capacitors thereby eliminating the effects of induced noise on the operation of the resonant circuit.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 3:
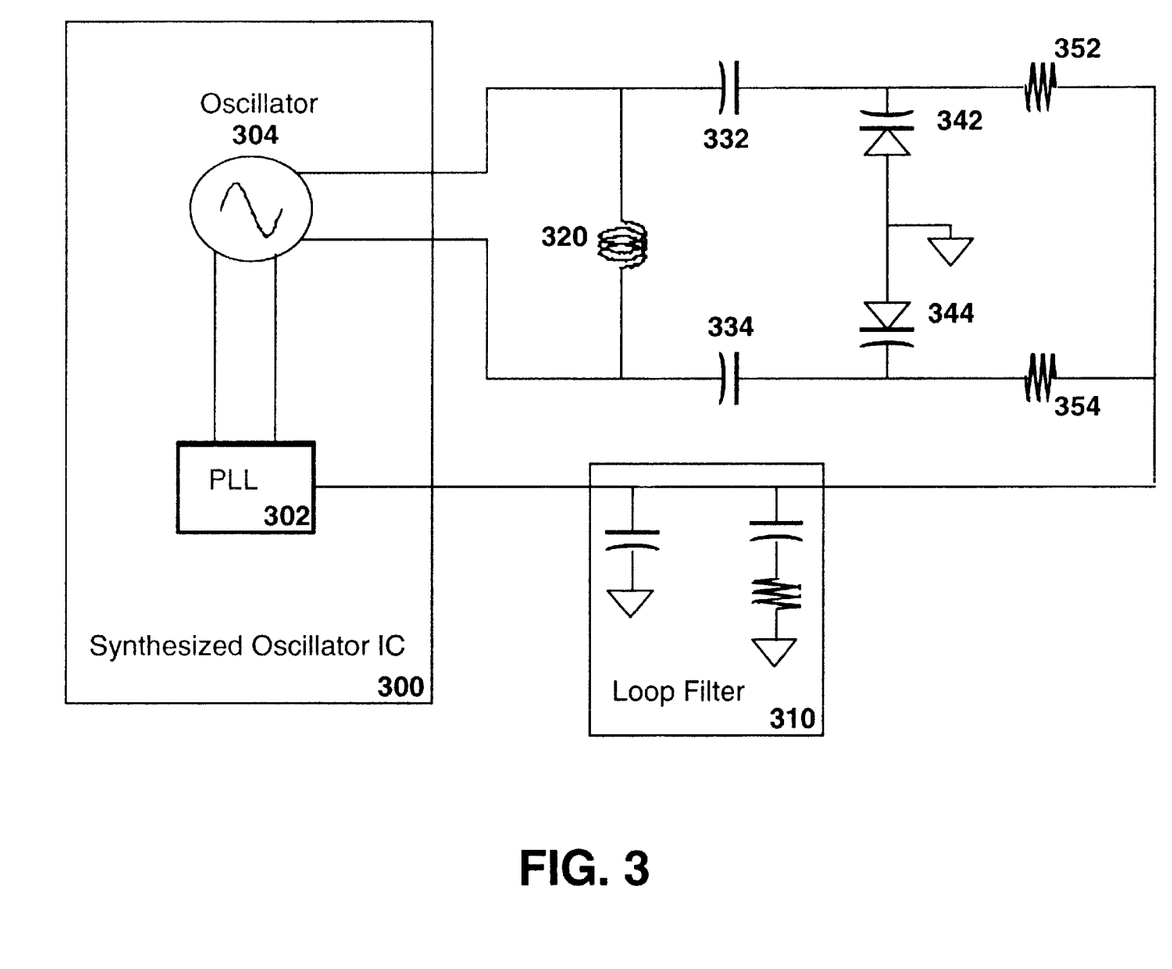
FIG. 3 is a block diagram of an integrated circuit synthesized oscillator.

FIG. 3 illustrates a block diagram of a typical local oscillator implementation used in a wireless phone. A synthesized oscillator IC incorporates a Phase Lock Loop (PLL) 302 as well as an amplifier configured as an oscillator 304. The synthesized oscillator IC 300 requires an external resonant circuit and loop filter 310 in order to operate. The oscillator 304 is configured as a Voltage Controlled Oscillator (VCO) if the resonant circuit can be tuned by the application of a control voltage.

The resonant circuit is comprised of an inductor 320 in parallel with a capacitive network. The capacitive network utilizes first and second variable capacitors, 342 and 344 respectively, connected in series. The first variable capacitor 342 is connected to a first side of the inductor 320 through a first tuning capacitor 332. The second variable capacitor 344 is connected to the second side of the inductor 320 through a second tuning capacitor 334. The point where the first variable capacitor 342 connects to the second variable capacitor 344 is tied to signal ground.

The oscillator 304 within the synthesized oscillator IC 300 operates at the frequency of the resonant circuit. A sample of the output of the oscillator 304 is routed to the PLL 302. The PLL 302 compares the phase of the oscillator 304 output signal against a reference signal (not shown). The resultant error signal is passed through a loop filter 310 then is applied to the resonant circuit. The output of the loop filter 310 is applied to the variable capacitors, 342 and 344, through first and second bias resistors, 352 and 354. A first bias resistor 352 connects the output of the loop filter 310 to the terminal of the first variable capacitor 342 that is connected to the first tuning capacitor 332. Similarly, a second bias resistor 354 is used to connect the output of the loop filter 310 to the terminal of the second variable capacitor 344 that is connected to the second tuning capacitor 334. The first variable capacitor 342 and the second variable capacitor 344 may be implemented as varactor diodes. The output of the loop filter 310 is used to reverse bias the varactor diodes. The varactor diodes change their capacitance values based on the level of reverse bias applied. Therefore, by controlling the varactor diode reverse bias voltage the frequency of the oscillator can be controlled. The control voltage is varied to maintain phase lock within the PLL 302.

When a wireless phone LO is configured as shown in FIG. 3 the oscillator 304 can only tune over the range of the resonant circuit. If the oscillator 304 is required to tune over a large frequency span such that the phone can cover multiple frequency bands, the resonant circuit must be capable of tuning over the entire range. Tuning the resonant circuit of FIG. 3 over a wide range can be accomplished in two ways.

A first method utilizes highly sensitive variable capacitors, 342 and 344. The control voltage range is maintained at a minimum value when highly sensitive variable capacitors are used. However, the sensitivity of the variable capacitors makes the resonant circuit sensitive to noise induced on the circuit. Any source of noise induced on the variable capacitor bias causes a shift in the resonant frequency of the circuit. If the rate of induced noise is higher than the loop bandwidth the PLL 302 is unable to correct the error.

A second method utilizes low sensitivity variable capacitors with an extended control voltage range. However, the extended control voltage range presents a problem for wireless phones operating off of battery power. Since the voltage provided by batteries is relatively low, the expansion of the control voltage range requires a step up of the available voltage. A voltage step up is accomplished with a DC-DC converter. A DC-DC converter does not operate at 100% efficiency. The loss in the step up voltage conversion is wasted battery power. Minimizing battery power consumption is a major priority in wireless phones. Another major priority in wireless phones is minimizing physical size. Both of these high priority design constraints discourage the use of extended control voltage ranges in a wireless phone.

An alternative resonant circuit configuration integrates switched components into the resonant circuit. The components are switched out of the resonant circuit for operation in a first frequency band and the components are switched into the resonant circuit for operation in a second frequency band.

Figure 4:
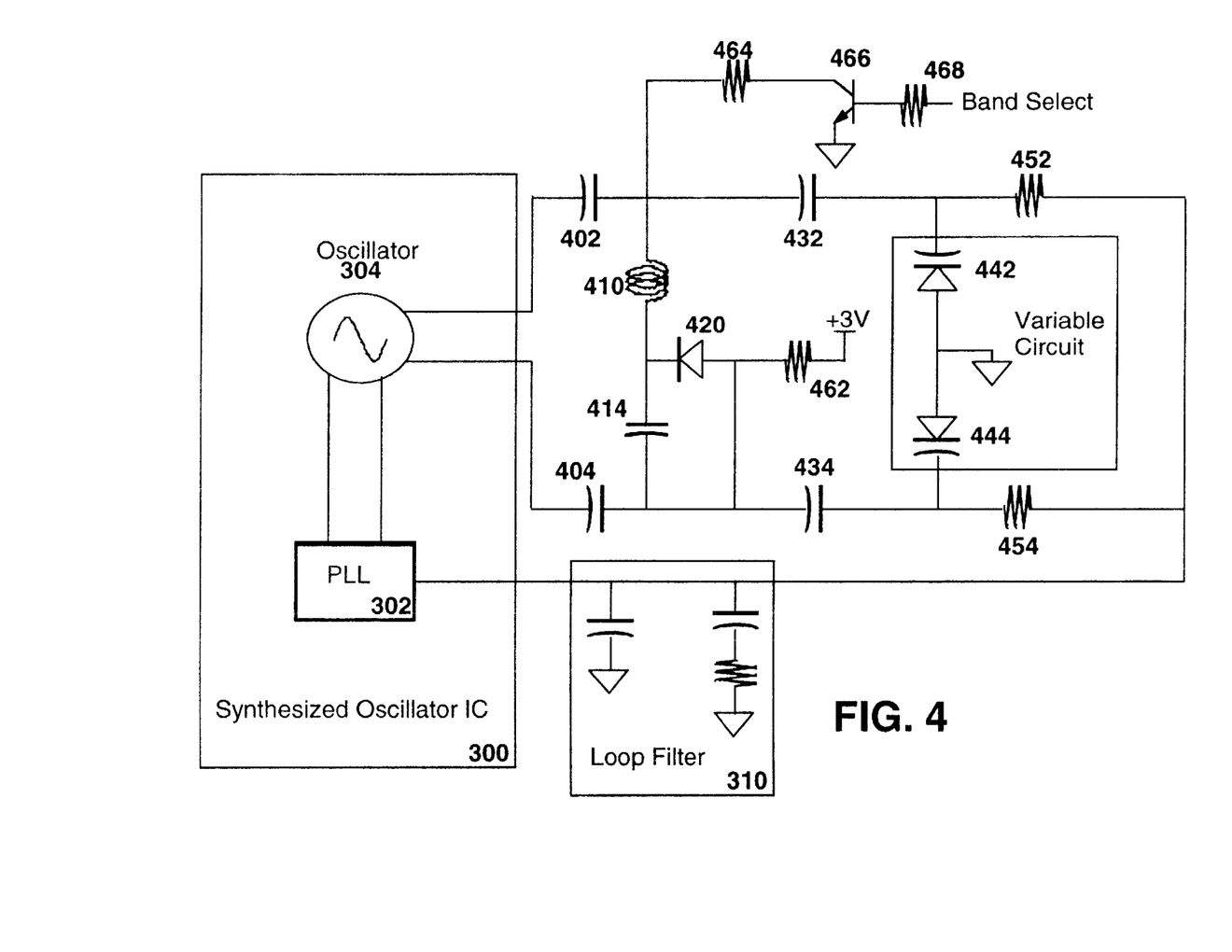
FIG. 4 is a block diagram showing the first embodiment of the invention incorporated with an integrated circuit oscillator.

The first embodiment of the present invention is illustrated in FIG. 4. The LO configuration utilizes the same synthesized oscillator IC 300 and loop filter 310 described in FIG. 3. However, the configuration of the resonant circuit in FIG. 4 differs from that shown in FIG. 3. The resonant circuit shown in FIG. 4 includes a switched capacitor 414 that can be switched into and out of the circuit according to the bias across the diode switch 420. However, the resonant circuit shown in FIG. 4 contains additional elements not incorporated in the resonant circuit of FIG. 3.

The resonant circuit shown in FIG. 4 incorporates first and second coupling capacitors, 402 and 404. These coupling capacitors will decrease the level of any noise from the Oscillator pins to the resonant circuit. The first terminal of each coupling capacitor is used to connect the resonant circuit to the respective terminal of the oscillator 304. The second terminal of each coupling capacitor, 402 and 404, is connected to opposite ends of the remainder of the resonant circuit. The second terminal of the first coupling capacitor 402 is connected to an inductor 410 placed in series with a switched capacitor 414. The end of the switched capacitor 414 that is not connected to the inductor is connected to the second terminal of the second coupling capacitor 404.

A diode switch 420 is connected in parallel with the switched capacitor 414. The anode of the diode switch 420 is connected to the second terminal of the second coupling capacitor 404 and the cathode of the diode switch 420 is connected to the junction of the inductor 410 and the switched capacitor 414. The anode of the diode switch 420 is pulled up to the supply voltage rail using a pull up resistor 462. At the junction of the first coupling capacitor 402 and the inductor 410 is a circuit used to control the forward bias on the diode switch 420. This circuit is comprised of a pull down resistor 464 connected to a DC switch 466. When the DC switch 466 is closed the pull down resistor 464 provides a DC path from the inductor 410 to ground. When the DC switch 466 is open, the pull down resistor 464 is open circuited and no current flows through it. A Band Select signal driving a control resistor 468 connected to the DC switch 466 controls the DC switch 466. The actual configuration of the switch placed in parallel with the switched capacitor 414 is not critical. The forward biased diode switch 420 shown in FIG. 4 is illustrative only and is not a limitation on the switch configuration that can be used in the resonant circuit. Any comparable switch placed in parallel with the switched capacitor 414 is allowable.

The remainder of the FIG. 4 resonant circuit is configured much like that shown in FIG. 3. A first tuning capacitor 432 connects the second terminal of the first coupling capacitor 402 to a first variable capacitor 442. A second tuning capacitor 434 connects the second terminal of the second coupling capacitor 404 to a second variable capacitor 444. The ends of the two variable capacitors, 442 and 444, opposite the tuning capacitors, 432 and 434, are connected together and tied to ground. The control voltage signal out of the loop filter 310 is applied to each of the variable capacitors, 442 and 444, through bias resistors 452 and 454. A first bias resistor 452 connects the control voltage signal out of the loop filter 310 to the junction of the first variable capacitor 442 and first tuning capacitor 432. A second bias resistor 454 connects the control voltage signal out of the loop filter 310 to the junction of the second variable capacitor 444 and second tuning capacitor 434. The bias resistors 452 and 454 apply the control voltage signal to reverse bias the variable capacitors when the variable capacitors 442 and 444 are implemented as varactor diodes. In present embodiment, the control voltage may be varied from 0–3 Volts. The control voltage signal is used to adjust the present invention for variations in components and variations due to temperature.

The ability to frequency band switch the first embodiment is described as follows. When the DC switch 466 is closed the diode switch 420 is forward biased and conducts. When the diode switch 420 conducts, the switched capacitor 414 is short circuited and does not electrically contribute to the resonant circuit. The resonant frequency $f_1$ is then determined by the value of the inductor in parallel with the capacitive tuning circuit comprised of the tuning capacitors, 432 and 434, in conjunction with the variable capacitors 442 and 444. When the Band Select signal controls the DC switch 466 to an open circuit condition the diode switch 420 no longer conducts.

The switched capacitor 414 is electrically connected to the resonant circuit when the diode switch 420 is not conducting. The resonant frequency $f_2$ of the circuit is increased when the switched capacitor 414 electrically contributes to the resonant circuit. The resonant frequency $f_2$ is increased because the switched capacitor 414 appears in series with the inductor 410. The series combination results in a reactance that is the sum of each reactance. Since the reactance of an inductor is opposite the reactance of a capacitor the effect of a series combination is a reactance that is less than the larger of the two reactances. The reactance of the switched capacitor 414 is chosen to be less than the reactance of the inductor 410 such that the series combination of the two elements has the reactance of an equivalently smaller inductor. A smaller inductor in the resonant circuit increases the resonant frequency.

The first embodiment of the invention shown in FIG. 4 has several advantages. One advantage is that the embodiment maximizes the circuit Q. The circuit Q is maximized because the circuit is implemented with the minimum number of inductors. Because of their physical structure, inductors have much lower component Q and larger size than capacitors. A resonant circuit that achieves band switching by the addition and removal of inductors will have a lower circuit Q than a resonant circuit that achieves band switching by the addition and removal of capacitors. Circuit Q is also maximized by the series combination of the inductor 410 and switched capacitor 414. The circuit Q is higher with the series combination of the inductor 410 and switched capacitor 414 because a larger inductor 410 value is used. Since inductor 410 component Q is determined as $X_L/R_L$ a larger value of inductance provides a higher component Q. It is also easier to center the two operating frequencies using capacitors over inductors because capacitor values are available in finer gradations than inductor values.

Another advantage of the first embodiment is increased noise immunity. When circuits on the transmit path are power gated on/off to conserve power during reduced rate transmission in a CDMA wireless phone system, the sudden changes in the power supply load result in fluctuations in the power supply output. The fluctuations in the power supply output affect all active components. The synthesized oscillator IC 300 may be affected by the power supply fluctuations by exhibiting a corresponding voltage ripple on all output lines. The voltage ripple will be exhibited on the terminals connecting to the resonant circuit as well as on the control voltage line to the loop filter 310.

The two coupling capacitors, 402 and 404, help to decrease the effect of any noise induced on the resonant circuit via the oscillator pins. The coupling capacitors, 402 and 404, provide additional reactances that serve to reduce the level of voltage ripple that ultimately reaches the variable capacitors, 442 and 444.

The band switch configuration of the resonant circuit provides increased noise immunity by minimizing the VCO gain. The VCO gain is a measure of the tuning sensitivity of the VCO, is denoted $K_V$, and is typically measured in MHZ/V. The band switch configuration minimizes the VCO gain by limiting the capacitance change required of the variable capacitors in the resonant circuit. The capacitance range is minimized because the large scale change required to switch frequency bands is performed by the inclusion of the switched capacitor 414. Therefore, a limited voltage control range can accurately control the oscillator frequency in both bands without increasing the value of $K_V$. In the first embodiment, the L and C values are selected such that the Kv values are about the same at the operating frequencies $f_1$ and $f_2$.

Figure 5:
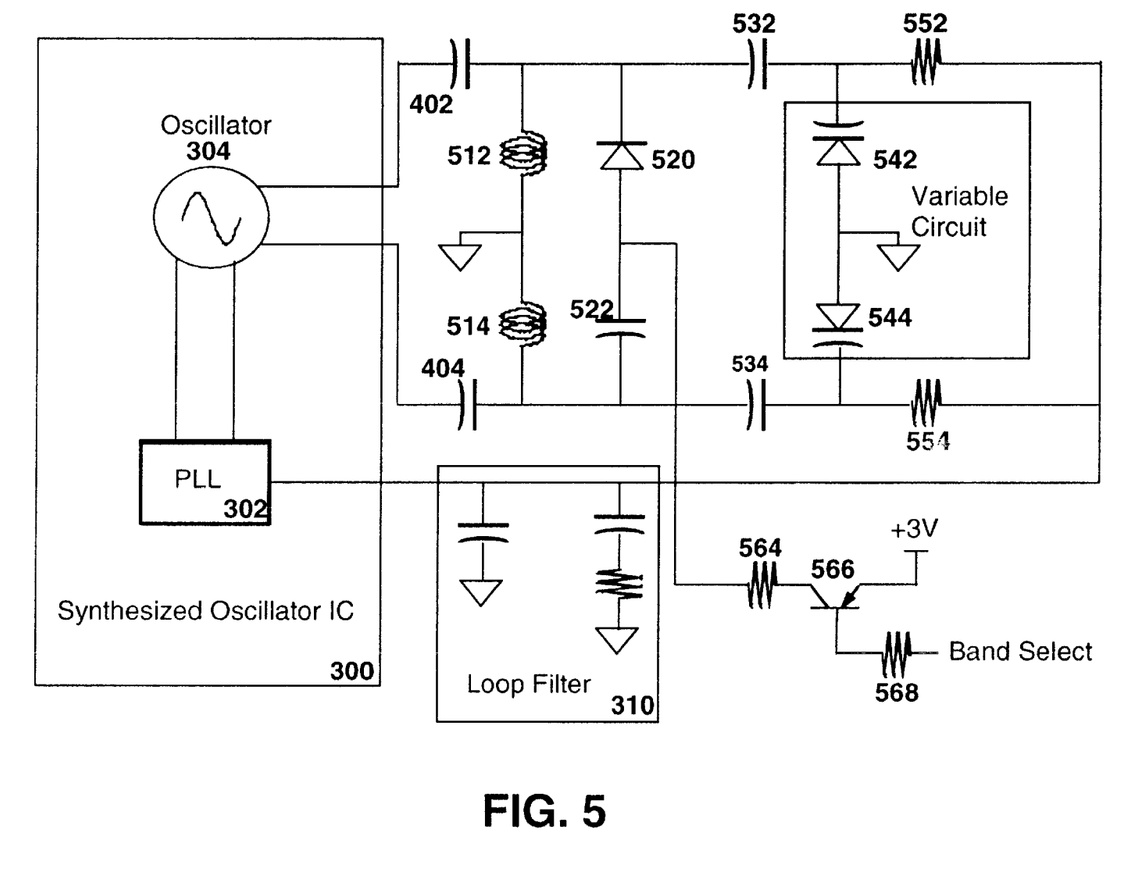
FIG. 5 is a block diagram showing the second embodiment of the invention incorporated with an integrated circuit oscillator.

A second embodiment of the invention, shown in FIG. 5, provides a greater level of noise immunity at a slight degradation in circuit Q. The second embodiment also utilizes a band switched resonant circuit configuration. The second embodiment is very similar to the first embodiment.

The second embodiment incorporates first and second coupling capacitors, 502 and 504, as the inputs to the resonant circuit. The synthesized oscillator IC 300 has a balanced pair of connections for the external resonant circuit. A first terminal of the first coupling capacitor 502 is connected to the positive resonant circuit interface connection of the synthesized oscillator IC 300. The second terminal of the first coupling capacitor is connected to a first inductor 512. The first inductor 512 provides a circuit path to ground. Similarly, a first terminal of the second coupling capacitor 504 is connected to the negative resonant circuit interface connection of the synthesized oscillator IC 300. The second terminal of the second coupling capacitor 504 connects to a second inductor 514. The second inductor 514 provides a circuit path to ground.

A switched capacitor 522 in series with a diode switch 520 connects the second terminal of the first coupling capacitor 502 to the second terminal of the second coupling capacitor 504. The anode of the diode switch 520 is connected to the switched capacitor 522 in the series connection. FIG. 5 shows the switched capacitor 522 connected to the second terminal of the second coupling capacitor 504 and the cathode of the diode switch 520 connected to the second terminal of the first coupling capacitor 502. However, the series connection of the switched capacitor 522 and the diode switch 520 can be reversed without affecting operation of the circuit. That is, the cathode of the diode switch 520 is connected to the second terminal of the second coupling capacitor 504 and the switched capacitor 522 is connected to the second terminal of the first coupling capacitor 502 with no change in circuit operation.

The circuit required to bias the diode switch 520 includes a pull up resistor 564 connected on one end to the anode of the diode switch 520 and connected on the other end to a DC switch 566. The DC switch 566 connects the pull up resistor 564 to the power supply rail when in the closed condition. When the DC switch 566 is closed DC current flows follows a path to ground through the pull up resistor 564, the forward biased diode switch 520 and the first inductor 512. When the DC switch 566 is in the open condition the pull up resistor 564 is open circuited and no current flows through the pull up resistor 564. A Band Select signal driving a control resistor 568 connected to the control terminal of the DC switch 566 controls the operation of the DC switch 566.

The remainder of the resonant circuit is configured in the same way as in the first embodiment. A first tuning capacitor 532 connects the second terminal of the first coupling capacitor 502 to a first variable capacitor 542. A second tuning capacitor 534 connects the second terminal of the second coupling capacitor 504 to a second variable capacitor 544. The ends of the two variable capacitors, 542 and 544, opposite the tuning capacitors, 532 and 534, are connected together and tied to ground. The control voltage signal out of the loop filter 310 is applied to each of the variable capacitors, 542 and 544, through bias resistors 552 and 554. A first bias resistor 552 connects the control voltage signal out of the loop filter 310 to the junction of the first variable capacitor 542 and first tuning capacitor 532. A second bias resistor 554 connects the control voltage signal out of the loop filter 310 to the junction of the second variable capacitor 544 and second tuning capacitor 534. The bias resistors 552 and 554 apply the control voltage signal to reverse bias the variable capacitors when the variable capacitors 542 and 544 are implemented as varactor diodes. In present embodiment, the control voltage may be varied from 0–3 Volts. The control voltage signal is used to adjust the present invention for variations in components and variations due to temperature.

The second embodiment of the invention also implements a band switched oscillator. When the diode switch 520 is forward biased the switched capacitor 522 is electrically connected to the resonant circuit. The switched capacitor 522 appears in the resonant circuit in parallel with the capacitive network comprised of the tuning capacitors, 532 and 534, and the variable capacitors, 542 and 544. Thus, the switched capacitor 522 increases the capacitance value in the resonant circuit. The effect is to lower the resonant frequency of the resonant circuit to $f_1$. When diode is off, the circuit operates at higher resonant frequency $f_2$. The resonant circuit in the second embodiment maintains a low value of $K_V$, the VCO gain, by providing coverage in both oscillator frequency bands through the use of a band switched resonant circuit.

The primary advantage of the resonant circuit of the second embodiment is in relation to noise immunity. As in the case of the first embodiment, the second embodiment provides greater noise immunity when compared to a wide band oscillator not utilizing a band switched configuration. The lower value of $K_V$, the VCO gain, in the band switched oscillator makes the band switched oscillator less sensitive to noise induced on the control voltage line Although the loop filter 310 will remove the majority of noise induced on the control voltage line, not all of the noise will be eliminated. An equivalent voltage ripple on the control voltage line of the wide band oscillator will result in a greater frequency deviation then the same voltage ripple induced on the control voltage line of the band switched oscillator. The improvement in noise immunity for the band switched design is the ratio of the VCO gains for the two oscillator designs.

The fully balanced design of the resonant circuit also produces increased immunity to noise induced at the inputs to the resonant circuit. The resonant circuit is configured as a high pass filter when viewed from either input terminal. The combination of a series coupling capacitor, 502 or 504, in conjunction with either the first or second inductor, 512 or 514, in shunt produces a two pole high pass filter. The high pass filter configuration is particularly helpful in eliminating noise from the synthesized oscillator IC 300. One particular source of noise from the synthesized oscillator IC 300 is attributable to power supply voltage fluctuations corresponding to power cycling of active devices in the transmit signal path. Power cycling of active devices in the transmit signal path occurs when a CDMA wireless phone operates at a reduced data rate. When the CDMA phone is operating in a reduced data rate only one copy of a number of repeated data periods is transmitted. This not only results in power savings in the phone but also a reduction in the average RF power transmitted from the phone. The reduced average phone RF transmit power results in less interference to other phones operating in the same band. Transmit power cycling results in power supply noise with a significant 800 Hz frequency component. The power supply noise is induced onto the resonant circuit via the interface connections of the synthesized oscillator IC 300. The high pass filter incorporated into the design of the resonant circuit eliminates the noise from the variable capacitors 542 and 544. The result is the resonant circuit is unaffected by noise induced from the synthesized oscillator IC 300 since no other components in the resonant circuit are affected by voltage variations. The output of the oscillator 304 then exhibits better phase noise because the resonant circuit is not affected by noise.

Figure 6:
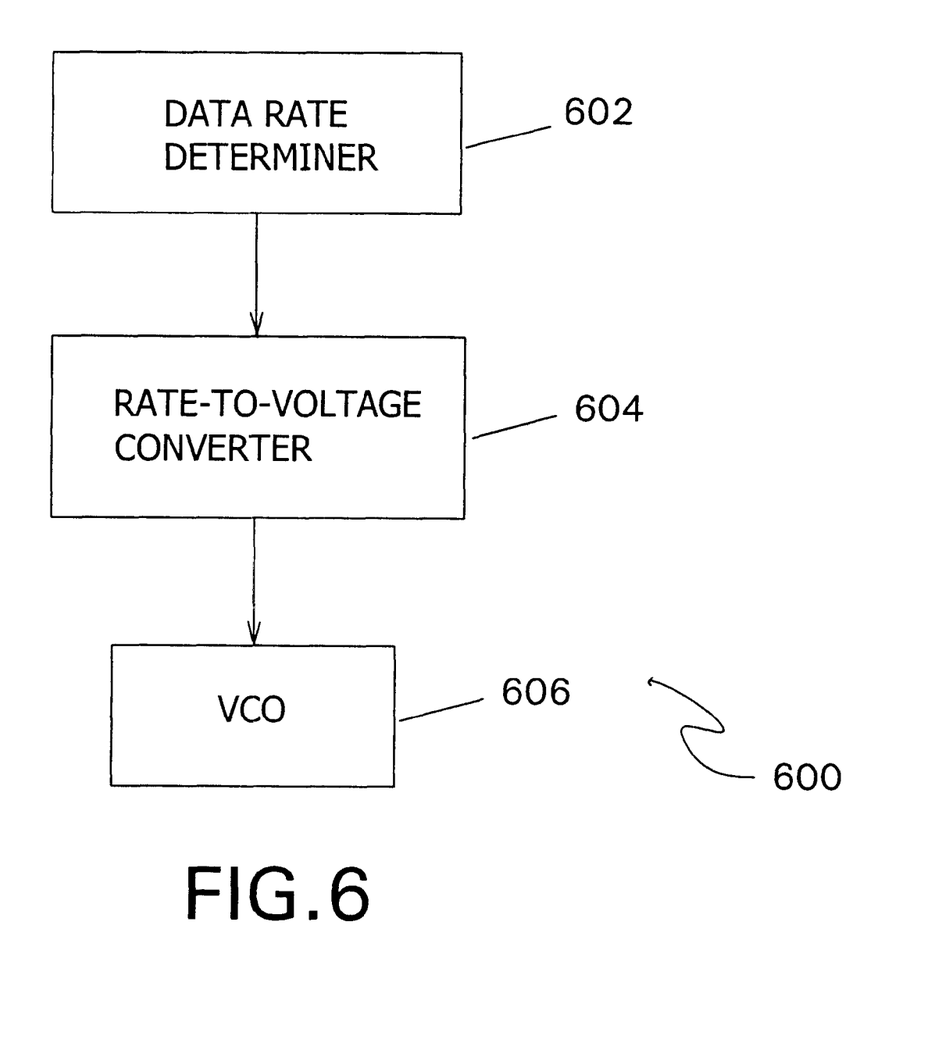
FIG. 6 is a block diagram of wireless phone system with an integrated circuit oscillator.

FIG. 6 is a block diagram of wireless phone system with an integrated circuit oscillator. The phone system 600 includes a data rate determiner 602, a rate-to-voltage converter 604, and a Voltage Controlled Oscillator 606. The determiner 602 determines, whether by measurement or by command, the rate at which data is to be transmitted. This determination is passed to the converter 604, which converts a first data rate into a first control voltage, a second data rate into a second control voltage, and so on. The control voltage is applied to the voltage controlled oscillator 606, which oscillates at a frequency determined by the state of the control voltage. Any of the oscillators described herein, and their equivalents, is suitable.

The invention provides an oscillator having a majority of desired characteristics. The high Q of the resonant circuit ensures the oscillator maintains a stable operating frequency for a given control voltage. The band switched design allows the oscillator to cover multiple frequency bands while maintaining a low value of VCO gain. This improves the phase noise of the oscillator output by desensitizing the VCO output to noise on the control voltage line. Most importantly, the resonant circuit design is relatively immune to induced noise. Noise induced onto the resonant circuit from an active oscillator circuit such as a synthesized oscillator IC is filtered in the resonant circuit before it can have an effect on the tuning elements within the resonant circuit. The filter is composed by structuring the elements of the resonant circuit into a high pass configuration. Therefore, the very elements that make up the resonant circuit simultaneously serve to filter out any noise. The result is a clean oscillator output regardless of the noisy operating environment the oscillator circuit.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A Voltage Controlled Oscillator (VCO) in a wireless phone system comprising:
   an amplifier; and
   a resonant circuit connected to the amplifier for tuning the oscillator to a desired operating frequency, said resonant circuit comprising:
      a variable circuit whose impedance is determined by a control voltage set to a first state for a first data rate for transmitted data and set to a second state for a second data rate for transmitted data in said wireless phone system; and
      a low frequency attenuating filter between an input to the resonant circuit and the variable circuit.

2. The VCO of claim 1 wherein the low frequency attenuating filter is a high pass filter.

3. The VCO of claim 1 wherein the low frequency attenuating filter is a bandpass filter.

4. The VCO of claim 1 wherein the resonant circuit is implemented as a balanced circuit configuration.

5. The VCO of claim 4 wherein the resonant circuit further comprises a second low frequency attenuating filter between a second input and the variable circuit.

6. The VCO of claim 5 wherein the resonant circuit further comprises a switch and a switched element for retuning the oscillator operating frequency.

7. The VCO of claim 6 wherein the switched element is a capacitor.

8. The VCO of claim 6 wherein the switch is a diode switch.

9. The VCO of claim 8 wherein the switched element is a capacitor.

10. The VCO of claim 1 wherein the resonant circuit further comprises a switch and a switched element for retuning the oscillator operating frequency.

11. The VCO of claim 10 wherein the resonant circuit further comprises an inductor and the switched element is connected in parallel to the inductor.

12. The VCO of claim 10 wherein the resonant circuit further comprises an inductor and the switched element is connected in series with the inductor when the switch is open circuited.

13. A method for increasing the noise immunity of a Voltage Controlled Oscillator (VCO) in a wireless phone system comprising:
   implementing a resonant circuit with a variable circuit whose impedance is determined by a control voltage set to a first state for a first data rate for transmitted data amd set to a second state for a second data rate for transmitted data in said wireless phone system and a low frequency attenuating filter between an input to the resonant circuit and the variable circuit; and
   connecting the resonant circuit to an amplifier.

14. A multiple band resonant circuit in a wireless phone system capable of tuning across a range of resonant frequencies within each band comprising:
   an inductor;
   a switched capacitor connected in series with the inductor;
   a variable circuit whose impedance is determined by a control voltage set to a first state for a first data rate for transmitted data and set to a second state for a second data rate for transmitted data in said wireless phone system;
   a first tuning capacitor connecting a first end of the series combination of the inductor and the switched capacitor to a first end of the variable circuit;
   a second tuning capacitor connecting a second end of the series combination of the inductor and switched capacitor to a second end of the variable circuit;
   a first coupling capacitor connected to the junction of the first tuning capacitor and the inductor;
   a second coupling capacitor connected to the junction of the second tuning capacitor and the switched capacitor; and
   a switch connected in parallel to the switched capacitor to selectively provide a short circuit connection across the switched capacitor thereby electrically removing the switched capacitor from the resonant circuit.

15. A multiple band resonant circuit in a wireless phone system capable of tuning across a range of resonant frequencies within each band comprising:
   an inductor;
   a first coupling capacitor connected to a first end of the inductor;
   a second coupling capacitor connected to a second end of the inductor;
   a switched capacitor;
   a switch connected in series with the switched capacitor, whereby the series combination of the switch and the switched capacitor is connected in parallel to the inductor;
   a variable circuit whose impedance is determined by a control voltage set to a first state for a first data rate for transmitted data and set to a second state for a second data rate for transmitted data in said wireless phone system;
   a first tuning capacitor connecting the first end of the inductor to a first end of the variable circuit; and
   a second tuning capacitor connecting the second end of the inductor to a second end of the variable circuit;
   wherein the switched capacitor contributes to the resonant frequency of the resonant circuit when the switch is enabled and the switched capacitor does not contribute to the resonant frequency of the resonant circuit when the switch is disabled.

* * * * *